United States Patent
Pak

(10) Patent No.: US 9,312,313 B2
(45) Date of Patent: Apr. 12, 2016

(54) ORGANIC LIGHT EMITTING DIODE DEVICE

(71) Applicant: SAMSUNG DISPLAY CO., LTD., Yongin, Gyeonggi-Do (KR)

(72) Inventor: Sang-Jin Pak, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 0 days.

(21) Appl. No.: 14/265,695

(22) Filed: Apr. 30, 2014

(65) Prior Publication Data

US 2014/0374712 A1    Dec. 25, 2014

(30) Foreign Application Priority Data

Jun. 24, 2013   (KR) .......................... 10-2013-0072409

(51) Int. Cl.
*H01L 27/32* (2006.01)
*H01L 51/52* (2006.01)

(52) U.S. Cl.
CPC ........... *H01L 27/3225* (2013.01); *H01L 51/524* (2013.01)

(58) Field of Classification Search
None
See application file for complete search history.

(56) References Cited

U.S. PATENT DOCUMENTS

| | | | |
|---|---|---|---|
| 6,885,029 B2 | 4/2005 | Miyazawa | |
| 2005/0200276 A1* | 9/2005 | Uhlig et al. | 313/506 |
| 2009/0122039 A1* | 5/2009 | Katoh et al. | 345/207 |
| 2011/0079178 A1 | 4/2011 | Schramm et al. | |
| 2014/0176507 A1* | 6/2014 | Daniel | 345/177 |

FOREIGN PATENT DOCUMENTS

| | | |
|---|---|---|
| KR | 10-2002-0046960 A | 6/2002 |
| KR | 10-2003-0007914 A | 1/2003 |

* cited by examiner

*Primary Examiner* — Michael Jung
(74) *Attorney, Agent, or Firm* — Lee & Morse, P.C.

(57) ABSTRACT

An organic light emitting device includes an organic light emitting element and a sensor. The organic light emitting element includes an organic layer between an anode and cathode. The sensor detects a quality that provides an indication of the degradation of the organic layer of the light emitting element. The sensor may be a chemical sensor or another type of sensor. The sensor may be fixed permanently within or outside the light emitting element, and electronic measures may be taken to reduce performance loss as a result of the detected degradation of the organic layer.

15 Claims, 3 Drawing Sheets

ORGANIC LIGHT EMITTING DIODE DEVICE

CROSS-REFERENCE TO RELATED APPLICATION

Korean Patent Application No. 10-2013-0072409, filed on Jun. 24, 2013, and entitled, "Organic Light Emitting Diode Device," is incorporated by reference herein in its entirety.

BACKGROUND

1. Field

One or more embodiments described herein relate to a display device.

2. Description of the Related Art

Flat panel displays have replaced the use of cathode ray tubes (CRTs) for many consumer- and business-related applications. This is because flat panel displays are lighter and thinner compared with CRTs.

One type of flat panel display, specifically a liquid crystal display (LCD), uses a separate backlight which has been shown to have problems in terms of response speed and viewing angle. Another type of flat plane display, known as an organic light emitting diode (OLED) display, can overcome these problems.

An OLED display may include an organic layer between two electrodes. The organic layer includes an emission layer. In operation, excitons are formed by the coupling of electrons from one electrode and holes from the other electrode in the mission layer. As a result, light is emitted. The organic layer may include an organic compound. The use of such a compound may reduce electronic and/or chemical durability over time, thereby compromising the quality or useful life of the display.

SUMMARY

In accordance with one embodiment, an organic light emitting device includes an organic light emitting element including an anode, an organic layer, and a cathode; and a chemical sensor that is at least one of inside or outside of the organic light emitting element. The chemical sensor may sense an amount of outgassing gas from the organic layer or an amount of a product generated from the outgassing gas.

The chemical sensor may include a transmission layer selectively permeable to the gas or product; a sensor to reversibly or non-reversibly interact with the permeated gas or product; and a detector to detect a change based on the interaction. The chemical sensor may detect a vibration change based on adsorption of the gas or the product.

The chemical sensor may include a hydrogen sensor. The hydrogen sensor may sense an amount of outgassing hydrogen from the organic layer or an amount of moisture generated from hydrogen. The hydrogen sensor may include a transmission layer selectively permeable to the hydrogen or moisture; a sensor to reversibly or non-reversibly interact with the permeated hydrogen or moisture; and a detector to detect a change based on the interaction. The hydrogen sensor may include a QCM (quartz crystal microbalance) or a SAW (surface acoustic wave) sensor. The chemical sensor may sense a vibration change caused by adsorption of the hydrogen or the moisture.

The device may include a supporting substrate to support the organic light emitting element; an opposing substrate facing the supporting substrate; and a seal to seal the supporting substrate and opposing substrate, wherein the chemical sensor is within a region defined by the supporting substrate, opposing substrate, and seal.

The chemical sensor may be at a location that corresponds to at least one of inside of the organic light emitting element, between the organic light emitting element and opposing substrate, or between the organic light emitting element and the seal.

The organic layer may include an emission layer. The organic layer may include at least one of a hole auxiliary layer between the anode and the emission layer, or an electron auxiliary layer between the cathode and the emission layer.

In accordance with another embodiment, a device includes an organic light emitter that includes an organic layer; and a sensor to detect a quality indicative of a degree of degradation of the organic layer. The quality may be an amount of a gas from the organic layer, such as hydrogen gas. Additionally, or alternatively, the quality may be an amount of moisture derived from a gas from the organic layer.

The sensor may be located inside the organic light emitter. The quality may be indicative of one or more dangling bonds and/or trap levels of the organic light emitter. The quality may be indicative of a concentration of dangling bonds and/or trap levels between HOMO and LUMO levels in the organic light emitter.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
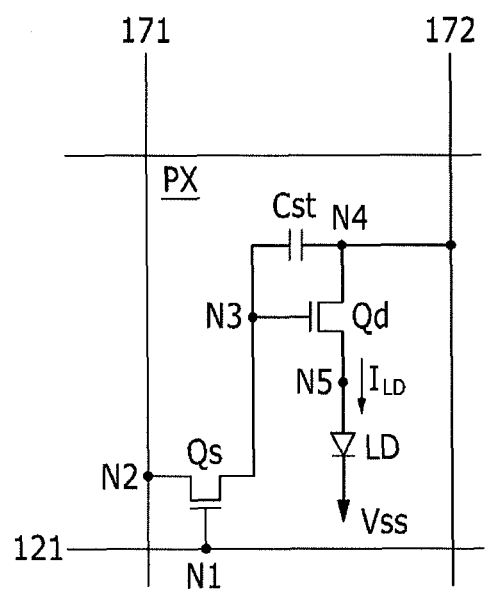
FIG. 1 illustrates an embodiment of an OLED pixel.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

FIG. 1 illustrates an embodiment of a unit pixel of an organic light emitting device. Referring to FIG. 1, the organic light emitting device includes a plurality of signal lines 121, 171, and 172, and a pixel PX connected thereto.

The signal lines include a plurality of scanning signal lines 121 for transmitting gate (or scanning) signals, a plurality of data lines 171 for transmitting data signals, and a plurality of driving voltage lines 172 for transmitting a driving voltage. The scanning signal lines 121 extend substantially in a row direction and substantially parallel to each other. The data lines 171 extend substantially in a column direction and substantially parallel to each other. The driving voltage lines 172 extend substantially in a column direction and substantially parallel to each other. In other embodiments, the lines may be oriented in different directions to form, for example, a mesh shape or another shape.

The pixel PX includes a switching transistor Qs, a driving transistor Qd, a capacitor Cst, and an organic light emitting element LD. The switching transistor Qs has a control terminal N1, an input terminal N2, and an output terminal N3. The control terminal N1 is connected to the scan signal line 121, the input terminal N2 is connected to the data line 171, and the output terminal N3 is connected to the driving transistor Qd. The switching transistor Qs transmits data signals applied to the data line 171 to the driving transistor Qd in response to a gate signal applied to the scanning signal line 121.

The driving transistor Qd also includes the control terminal N3, the input terminal N4, and the output terminal N5. The control terminal N3 is connected to the switching transistor Qs, the input terminal N4 is connected to the driving voltage line 172, and the output terminal N5 is connected to the organic light emitting element LD. The driving transistor Qd drives an output current ILD having a magnitude depending on the voltage between the control terminal N3 and the output terminal N5 thereof.

The capacitor Cst is connected between the control terminal N3 and the input terminal N4 of the driving transistor Qd. The capacitor Cst stores a data signal applied to the control terminal of the driving transistor Qd, and maintains the data signal after the switching transistor Qs turns off.

The organic light emitting element LD is an organic light emitting diode (OLED), which has an anode connected to the output terminal N5 of the driving transistor Qd and a cathode connected to a common voltage Vss. The organic light emitting element LD emits light having an intensity depending on an output current ILD of the driving transistor Qd, to thereby display images. The organic light emitting element LD may include an organic material uniquely emitting at least one of three primary colors, e.g., red, green, or blue. The organic light emitting device displays desired images based a spatial sum of the colors of light.

The switching transistor Qs and the driving transistor Qd are n-channel field effect transistors (FETs). In other embodiments, at least one of these transistors may be a p-channel FET. In addition, the connections among the transistors Qs and Qd, the capacitor Cst, and the organic light emitting diode LD may be modified in other embodiments.

Figure 2:
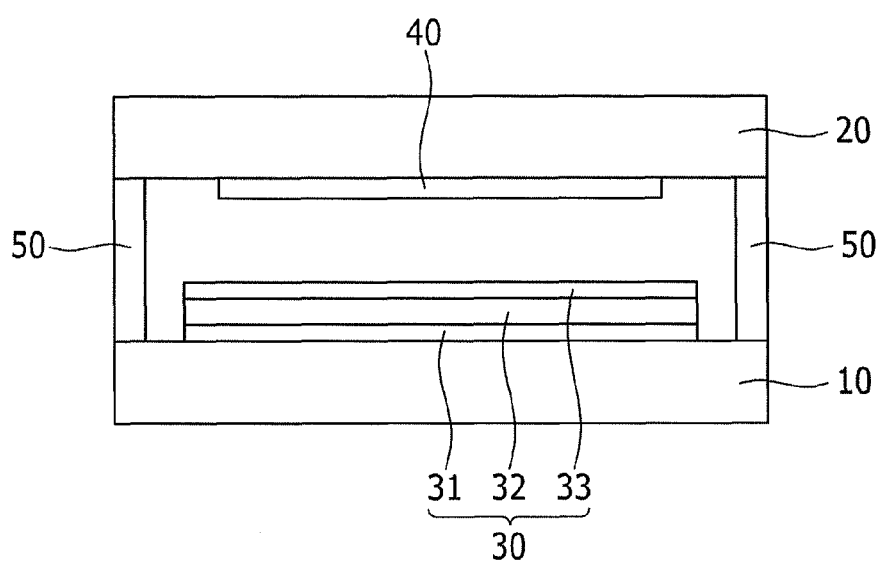
FIG. 2 illustrates an embodiment of an OLED device.
Figure 3:
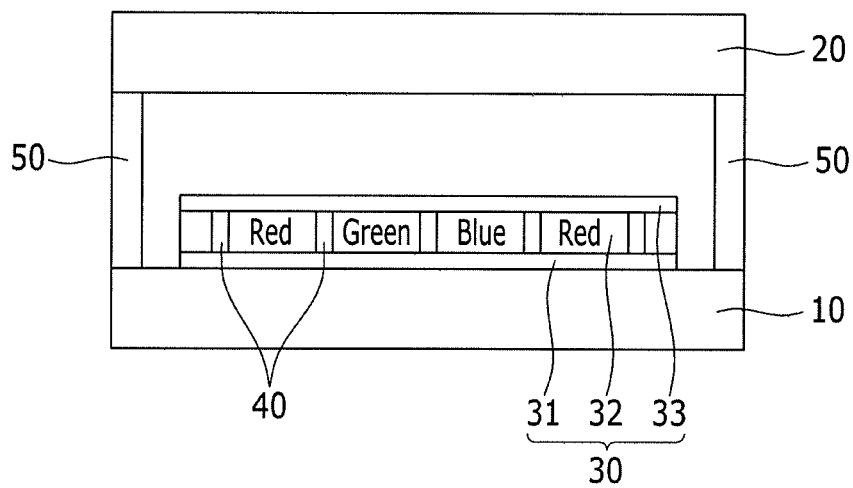

FIG. 2 illustrates an embodiment of an organic light emitting device which includes a supporting substrate 10, an opposing substrate 20 facing the supporting substrate 10, a sealing member 50 sealing the supporting substrate 10 and the opposing substrate 20, an organic light emitting element 30, and a chemical sensor 40. The organic light emitting element 30 and chemical sensor 40 are positioned at a region defined by the supporting substrate 10, opposing substrate 20, and sealing member 50.

The supporting substrate 10 may be a glass substrate, a silicon wafer, or a polymer substrate. For example, the polymer substrate may be made of polycarbonate, polymethylmethacrylate, polyethylene terephthalate, ethylene naphthalate, polyamide, polyethersulfone, or a combination thereof.

The plurality of signal lines 121, 171, and 172, the switching transistor Qs, and the driving transistor Qd are formed on the supporting substrate 10. The switching transistor Qs may include a gate electrode connected to the control terminal N1, a source electrode connected to the input terminal N2, a drain electrode connected to the output terminal N3. This device may have various structures, such as a bottom gate structure in which the gate electrode is positioned under a semiconductor layer or substrate, a top gate structure in which the gate electrode is positioned on the semiconductor layer or substrate, a bottom contact structure in which a lower surface of the semiconductor layer or substrate is in contact with the source electrode and the drain electrode, or a top-contact structure in which an upper surface of the semiconductor layer or substrate is in contact with the source electrode and drain electrode.

The opposing substrate 20 may be an encapsulation substrate, a glass plate, a metal plate, a polymer thin film, or a combination thereof.

The sealing member 50 bonds the supporting substrate 10 and the opposing substrate 20. The sealing member 50 may be positioned, for example, according to a circumference of the supporting substrate 10 and the opposing substrate 20. The sealing member 50 serves to seal a space between the supporting substrate 10 and the opposing substrate 20.

The organic light emitting element 30 is positioned on the supporting substrate 10, and includes a lower electrode 31, an organic layer 32, and an upper electrode 33.

One of the lower electrode 31 or the upper electrode 33 is an anode, and the other is a cathode. For example, the lower electrode 31 may be the anode and the upper electrode 33 may be the cathode.

When the lower electrode 31 is a transparent electrode, the organic light emitting device may be a bottom emission type, in which light is emitted through a surface of the supporting substrate 10. When the upper electrode 33 is a transparent electrode, the organic light emitting device may be a top emission type, in which light is emitted through a surface of the opposing substrate 20. Also, when the lower electrode 31 and upper electrode 33 are both transparent electrodes, the organic light emitting device may be a dual-sided light emission type, in which light is emitted at through surfaces of the supporting substrate 10 and the opposing substrate 20.

The lower electrode 31 may be formed of a transparent conductive oxide such as indium tin oxide (ITO) or indium zinc oxide (IZO).

The upper electrode 33 may include, for example, magnesium (Mg) or a magnesium alloy. The magnesium alloy may be a magnesium-silver alloy (MgAg) or a dual layer of a magnesium (Mg) layer and a silver (Ag) layer. For example, the magnesium-silver alloy (MgAg) may be an alloy in which magnesium (Mg) and silver (Ag) may be co-deposited at a ratio of about 10:1.

The organic layer 32 may include at least one layer including an emission layer.

For example, the organic layer 32 may only include the emission layer, or may include the emission layer and an auxiliary layer.

The emission layer is made of an organic material that emits light of one or more of predetermined colors (e.g., one or more primary colors such as red, green, or blue), or a mixture of the organic material and an inorganic material. The organic material may include a polyfluorene derivative, a (poly)paraphenylenevinylene derivative, a polyphenylene derivative, a polyfluorene derivative, polyvinylcarbazole, a polythiophene derivative, or compounds in which polymer materials thereof are doped with a perylene-family pigment, a coumarin-family pigment, a rhodamine-family pigment, rubrene, perylene, 9,10-diphenylanthracene, tetraphenylbutadiene, Nile red, coumarin, quinacridone, etc. The organic light emitting display apparatus displays a desired image by spatially synthesizing (primary) colored light emitted from the light emitting layer.

The emission layer may emit white light by a combination of the primary colors, such as three primary colors of red, green, and blue. The white light may be emitted by combining colors of neighboring pixels or by combining colors deposited in a vertical direction.

The auxiliary layer may be positioned between the lower electrode 31 and emission layer and/or between the upper electrode 33 and emission layer, to improve luminous efficiency. The auxiliary layer may include at least one selected from the group consisting of an electron transport layer (ETL) and a hole transport layer (HTL) that achieve a balance of electrons and holes, an electron injection layer (EIL) and a hole injection layer (HIL) that reinforce the injection of electrons and holes, and a hole blocking layer and an electron blocking layer blocking a movement of a reversed charge.

For example, the auxiliary layer may include at least one of at least one hole auxiliary layer positioned between the lower electrode 31 and emission layer or at least one electron auxiliary layer positioned between the upper electrode 33 and emission layer when the lower electrode 31 is the anode and the upper electrode 33 is the cathode. The hole auxiliary layer may include, for example, the hole transport layer (HTL), the hole injection layer (HIL), and/or the electron blocking layer. The electron auxiliary layer may include, for example, the electron transport layer (ETL), the electron injection layer (EIL), and/or the hole blocking layer.

Chemical sensor 40 is illustrated as being disposed at a position corresponding to the organic light emitting element 30. In other embodiments, chemical sensor 40 may be disposed at a region that is blocked by the organic light emitting element 30.

For example, chemical sensor 40 may be positioned inside or outside the organic light emitting element 30, or both. When chemical sensor 40 is positioned inside the organic light emitting element 30, the chemical sensor 40 may be positioned between the pixels. When the chemical sensor 40 is positioned outside the organic light emitting element 30, the chemical sensor 40 may be positioned at a region defined by the supporting substrate 10, the opposing substrate 20, and the sealing member 50, between the organic light emitting element 30 and the opposing substrate 20, and/or between the organic light emitting element 30 and the sealing member 50. One or more chemical sensors 40 may be disposed at the same position or at different positions.

The chemical sensor 40 senses an amount of an outgassing gas from the organic layer 32, or an amount of a product generated from the outgassing gas. For example, the sensing may be executed by a vibration changed by adsorption of the gas or the product.

In one embodiment, chemical sensor 40 is a hydrogen sensor. The hydrogen sensor may sense an amount of outgassing hydrogen from the organic layer 32 or an amount of moisture generated from the outgassing hydrogen. The moisture may be generated from the hydrogen from the organic layer 32 and an inflow of oxygen from surroundings.

By sensing the amount of outgassing the hydrogen from the organic layer 32 or the amount of moisture generated from the hydrogen through the hydrogen sensor, information representing a degradation degree of the organic layer 32 may be determined. An electronic correction may then be performed based on the information.

An organic compound including the organic layer 32 may include an aryl group and/or a heteroaryl group. Most of the organic compound may be fused or non-fused. The organic compound may include a carbon-hydrogen bond or and/or heteroatom-hydrogen bond, as well as an intramolecular bond.

In the organic compound, a HOMO, a LUMO, and an energy band gap (corresponding to an interval between the HOMO and the LUMO) are determined by intramolecular bonding. A target luminance may be obtained based on intermolecular bonding (e.g., dangling bonds) and/or trap levels that are formed between the HOMO and LUMO.

As the organic compound degrades, while the carbon-hydrogen bond and/or heteroatom-hydrogen bond is broken, hydrogen is separated from the organic compound. Non-bonding portions (referred to as dangling bonds) may be simultaneously generated. For the non-bonding portions, an additional energy level (or "trap level") is formed between the HOMO and the LUMO, to trap the electrons and holes. The trapped electrons and holes do not participate in the formation of excitons. As a result, the luminous efficiency may decrease and the luminance may be reduced.

As previously described, by sensing the amount of outgassing hydrogen and/or the amount of the moisture generated from the hydrogen using chemical sensor 40, the amount of hydrogen separated from the organic compound may be measured. As a result, the information indicative of dangling bonds and trap levels may be predicted to determine the degradation degree of the organic layer 32. When determining the degradation degree of the organic layer 32, the electronic correction may be preemptively performed according to the degradation degree, thereby preventing performance degradation of the organic light emitting device.

The hydrogen sensor may have a structure including a material, a particle, or a thin film that reversibly or non-reversibly interacts with hydrogen to form a predetermined reaction. For example, when the hydrogen sensor reacts with hydrogen, the hydrogen sensor may include a material, a particle, or a thin film of which a visual characteristic such as a color change, an acoustic characteristic such as a noise, an optical characteristic such that transmittance, electrical conductivity, or an electric characteristic such as a resistance is changed.

The hydrogen sensor may include a transmission element selectively permeating hydrogen or the moisture generated from hydrogen, a sensor element that reversibly or non-reversibly interacts with hydrogen, and a detection element detecting the change by the interaction, but is not limited thereto.

In one embodiment, the hydrogen sensor is a QCM (quartz crystal microbalance) or a SAW (surface acoustic wave) sensor. When a quartz crystal is inserted between the electrodes facing each other and a voltage is applied, the QCM may sense an amount of change of about a nanogram, by a method in which vibration is generated at a frequency corresponding to a mechanical resonance point between the electrodes and the quartz crystal. When the QCM is used as chemical sensor 40, the amount of the outgassing hydrogen and/or the amount of the moisture generated from hydrogen may be sensed.

The SAW sensor uses a pair of electrodes formed on a piezoelectric substrate to detect a change of a propagation speed of a surface elastic wave, based on a physical change applied to the piezoelectric substrate. When the SAW included in chemical sensor 40, the amount of outgassing hydrogen or the amount of the moisture from hydrogen may be detected based on the change of propagation speed of the surface elastic wave. As one example of the SAW, the amount of the moisture may be sensed from the change of the surface elastic wave by moisture adsorption by using a porous metal such as titanium (Ti)/tantalum (Ta).

The hydrogen sensor sensing the amount of the outgoing hydrogen or the amount of the moisture generated from the hydrogen has heretofore been described. In other embodiments, other types of chemical sensors may be used for sensing degradation of an organic compound forming the organic layer 32 may be applied.

In accordance with one embodiment, a method of analyzing and compensating a degradation degree of an organic compound of the organic layer is provided. In one example, an organic light emitting device includes a sensor to simply and correctly measures the degradation degree of an organic compound. Also, an organic light emitting device including an organic light emitting element, which includes an anode, an organic layer, and a cathode, and a chemical sensor, are positioned in inside, outside, or both of the organic light emitting element. By simply and clearly measuring degradation degree of the organic compound and performing an electronic correction based on information indicative of the degradation degree, a performance degradation of the organic light emitting device may be preemptively prevented.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting device, comprising:
   an organic light emitting element including an anode, an organic layer, and a cathode; and
   a chemical sensor that is at least one of inside or outside of the organic light emitting element, wherein the chemical sensor is to sense an amount of outgassing gas from the organic layer or an amount of a product generated from the outgassing gas, the amount of outgassing gas or product indicative of a degradation degree of the organic layer, and wherein the chemical sensor includes:
   a transmission layer selectively permeable to the gas or product;
   a sensor to reversibly or non-reversibly interact with the permeated gas or product; and
   a detector to detect a change based on the interaction.

2. The device as claimed in claim 1, wherein the product generated from the outgassing gas includes moisture.

3. The device as claimed in claim 2, wherein the chemical sensor is to sense a vibration change based on adsorption of the gas or the product.

4. The device as claimed in claim 1, wherein the chemical sensor includes a hydrogen sensor that includes the transmission layer, sensor, and detector.

5. The device as claimed in claim 4, wherein the hydrogen sensor senses an amount of outgassing hydrogen from the organic layer or an amount of moisture generated from hydrogen.

6. The device as claimed in claim 5, wherein the chemical sensor is to sense a vibration change caused by adsorption of the hydrogen or the moisture.

7. The device as claimed in claim 4, wherein the hydrogen sensor includes a QCM (quartz crystal microbalance) or a SAW (surface acoustic wave) sensor.

8. The device as claimed in claim 1, further comprising:
   a supporting substrate to support the organic light emitting element;
   an opposing substrate facing the supporting substrate; and
   a seal to seal the supporting substrate and opposing substrate, wherein the chemical sensor is within a region defined by the supporting substrate, opposing substrate, and seal.

9. The device as claimed in claim 8, wherein the chemical sensor is at a location that corresponds to at least one of:
   inside of the organic light emitting element,
   between the organic light emitting element and opposing substrate, or
   between the organic light emitting element and the seal.

10. The device as claimed in claim 1, wherein the organic layer includes an emission layer.

11. The device as claimed in claim 10, wherein the organic layer includes at least one of:
    a hole auxiliary layer between the anode and the emission layer, or
    an electron auxiliary layer between the cathode and the emission layer.

12. A device, comprising:
    an organic light emitter that includes an organic layer; and
    a hydrogen sensor to detect a quality indicative of a degree of degradation of the organic layer, wherein the quality includes an amount of outgassing gas from the organic layer or an amount of a product generated from the outgassing gas, the amount of outgassing gas or product indicative of a degradation degree of the organic layer, wherein the hydrogen sensor includes a QCM (quartz crystal microbalance) or a SAW (surface acoustic wave) sensor.

13. The device as claimed in claim 12, wherein the product is an amount of moisture derived from hydrogen gas from the organic layer.

14. The device as claimed in claim 12, wherein the amount of outgassing hydrogen gas or product is indicative of the concentration of dangling bonds or trap levels between HOMO and LUMO levels in the organic light emitter.

15. An organic light emitting device, comprising:
    an organic light emitting element including an anode, an organic layer, and a cathode; and
    a chemical sensor that is at least one of inside or outside of the organic light emitting element, wherein the chemical sensor is to sense an amount of outgassing gas from the organic layer or an amount of a product generated from the outgassing gas, the amount of outgassing gas or product indicative of a degradation degree of the organic layer, and wherein the chemical sensor includes a QCM (quartz crystal microbalance) sensor or a SAW (surface acoustic wave) sensor.

* * * * *